(12) United States Patent
Kii et al.

(10) Patent No.: US 9,280,066 B2
(45) Date of Patent: Mar. 8, 2016

(54) STAGE APPARATUS, LITHOGRAPHY APPARATUS AND METHOD OF MANUFACTURING ARTICLE

(71) Applicant: CANON KABUSHIKI KAISHA, Tokyo (JP)

(72) Inventors: Hiroshi Kii, Utsunomiya (JP); Nobushige Korenaga, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 56 days.

(21) Appl. No.: 14/334,039

(22) Filed: Jul. 17, 2014

(65) Prior Publication Data
US 2015/0029484 A1   Jan. 29, 2015

(30) Foreign Application Priority Data
Jul. 23, 2013 (JP) .................. 2013-152913

(51) Int. Cl.
*G03B 27/58* (2006.01)
*G03F 7/20* (2006.01)

(52) U.S. Cl.
CPC .............. *G03F 7/70716* (2013.01); *G03F 7/70* (2013.01)

(58) Field of Classification Search
CPC .................... G03F 7/70525; G03F 7/70716
USPC ............... 355/30, 53, 72–76; 310/10, 12
See application file for complete search history.

(56) References Cited

U.S. PATENT DOCUMENTS

| 6,084,319 A | 7/2000 | Kamata et al. |
| 8,674,562 B2 * | 3/2014 | Yoshida ............. H02K 3/24 310/12.29 |
| 2001/0055102 A1 * | 12/2001 | Emoto ............. G03F 7/70525 355/53 |

FOREIGN PATENT DOCUMENTS

JP          3278380 B2     4/2002

* cited by examiner

*Primary Examiner* — Hung Henry Nguyen
(74) *Attorney, Agent, or Firm* — Rossi, Kimms & McDowell LLP

(57) ABSTRACT

The present invention provides a stage apparatus which holds a substrate, including a first moving stage, a second moving stage supported by the first moving stage, a linear motor including a coil arranged on the first moving stage, and a magnet arranged on the second moving stage in correspondence with the coil, a first channel formed in the first moving stage to supply a first refrigerant for recovering heat from the coil not to contact the coil, a cover member arranged on the first moving stage to surround the coil and be spaced apart from the coil, and a second channel formed in the cover member to supply a second refrigerant for recovering heat from the cover member not to contact the coil.

10 Claims, 2 Drawing Sheets

STAGE APPARATUS, LITHOGRAPHY APPARATUS AND METHOD OF MANUFACTURING ARTICLE

BACKGROUND OF THE INVENTION

1. Field of the Invention

The present invention relates to a stage apparatus, a lithography apparatus, and a method of manufacturing an article.

2. Description of the Related Art

A lithography apparatus used to manufacture a semiconductor device or liquid crystal device positions a substrate held by a substrate stage, and performs a process (for example, exposure) of transferring a pattern on the substrate. The substrate stage generally includes a coarse moving stage which performs large-stroke movement, and a fine moving stage which performs high-precision positioning on the coarse moving stage. Movement by the fine moving stage is performed by driving a linear motor. In terms of vibration transmission, a linear motor magnet is arranged on the fine moving stage side, and a linear motor coil is arranged on the coarse moving stage side.

Such a substrate stage has the problem of heat generation of the linear motor (that is, linear motor coil). To solve this, Japanese Patent No. 3278380 proposes a cooling mechanism which recovers heat from a linear motor coil. The cooling mechanism disclosed in Japanese Patent No. 3278380 covers the space around the linear motor coil with a jacket, and the space is filled with a fluid refrigerant to recover heat from the linear motor coil.

When the space around the linear motor coil is filled with a fluid refrigerant, a coating process is required to form a coating on the lead wire of the coil so the lead wire of the coil and the refrigerant do not directly contact each other. However, if the coating formed by the coating process is damaged in the assembly of a substrate stage, the lead wire of the coil and the refrigerant contact each other, and the lead wire of the coil sometimes corrodes and is disconnected. The coating itself is highly likely to corrode upon exposure to the refrigerant for a long period. If the coating corrodes, the coil may short-circuit. It is therefore difficult to maintain the reliability of the substrate stage in the cooling mechanism requiring a coating process on the lead wire of a coil.

SUMMARY OF THE INVENTION

The present invention provides a technique advantageous for reducing heat transferring from the coil of a linear motor to a fine moving stage.

According to one aspect of the present invention, there is provided a stage apparatus which holds a substrate, including a first moving stage, a second moving stage supported by the first moving stage, a linear motor including a coil arranged on the first moving stage, and a magnet arranged on the second moving stage in correspondence with the coil, a first channel formed in the first moving stage to supply a first refrigerant for recovering heat from the coil not to contact the coil, a cover member arranged on the first moving stage to surround the coil and be spaced apart from the coil, and a second channel formed in the cover member to supply a second refrigerant for recovering heat from the cover member not to contact the coil.

Further aspects of the present invention will become apparent from the following description of exemplary embodiments with reference to the attached drawings.

DESCRIPTION OF THE EMBODIMENTS

Figure 1:
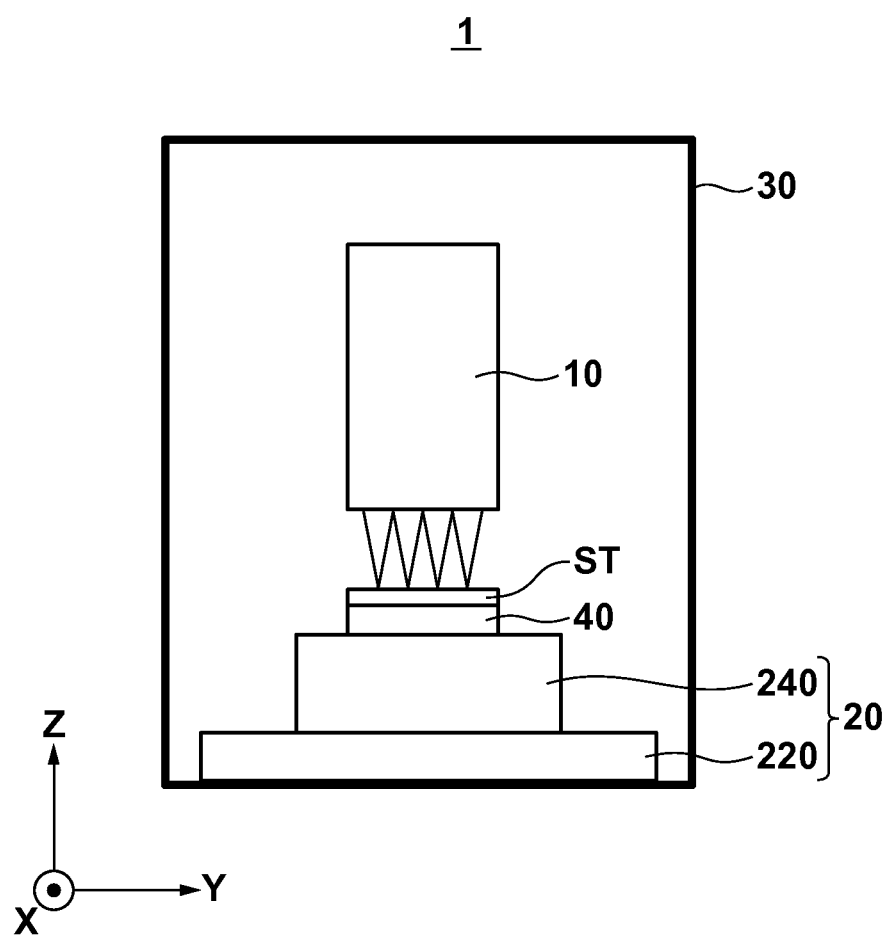
FIG. 1 is a schematic view showing the arrangement of a lithography apparatus as one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of a lithography apparatus 1 as one aspect of the present invention. The lithography apparatus 1 is an apparatus which transfers a pattern on a substrate. In the embodiment, the lithography apparatus 1 is implemented as a drawing apparatus which draws a pattern on a substrate by using a charged particle beam (electron beam). However, the lithography apparatus 1 is not limited to the drawing apparatus, and may be an imprint apparatus or exposure apparatus. The imprint apparatus is an apparatus which cures a resin while bringing the resin on a substrate into contact with a mold, and separates the mold from the cured resin, thereby transferring a pattern on the substrate. The exposure apparatus is an apparatus which projects the pattern of a reticle (mask) on a substrate by a projection optical system, thereby transferring the pattern on the substrate.

The lithography apparatus 1 includes a charged particle optical system 10, a stage apparatus 20 which moves while holding a substrate ST, and a chamber 30. In the lithography apparatus 1, the chamber 30 accommodates the charged particle optical system 10 and stage apparatus 20 in order to perform drawing of a pattern with a charged particle beam in the vacuum atmosphere. The chamber 30 maintains, in the vacuum atmosphere, the internal space in which the charged particle optical system 10 and stage apparatus 20 are accommodated.

The charged particle optical system 10 includes, for example, a charged particle lens (electrostatic lens), collimator lens, aperture array, blanker array, stopping aperture array, and deflector. The charged particle optical system 10 guides a charged particle beam emitted by a charged particle source (not shown) to the substrate ST to draw a pattern on the substrate ST. In this manner, the charged particle optical system 10 has the aspect of a processing unit which performs a transfer process of transferring a pattern on the substrate ST.

The stage apparatus 20 includes a coarse moving stage (first moving stage) 220, and a fine moving stage (second stage) 240 supported by the coarse moving stage 220. The coarse moving stage 220 is arranged on a base plate (not shown), supports the fine moving stage 240, and moves the fine moving stage 240 in the X- and Y-axis directions (that is, within the X-Y plane). The fine moving stage 240 supports a chuck 40 functioning as a substrate holding unit which holds (for example, electrostatically chucks) the substrate ST. The fine moving stage 240 has a function of correcting rotation of the substrate ST around the Z-axis, a function of correcting the position of the substrate ST in the Z-axis direction, and a function of correcting the tilt of the substrate ST.

Figure 2:
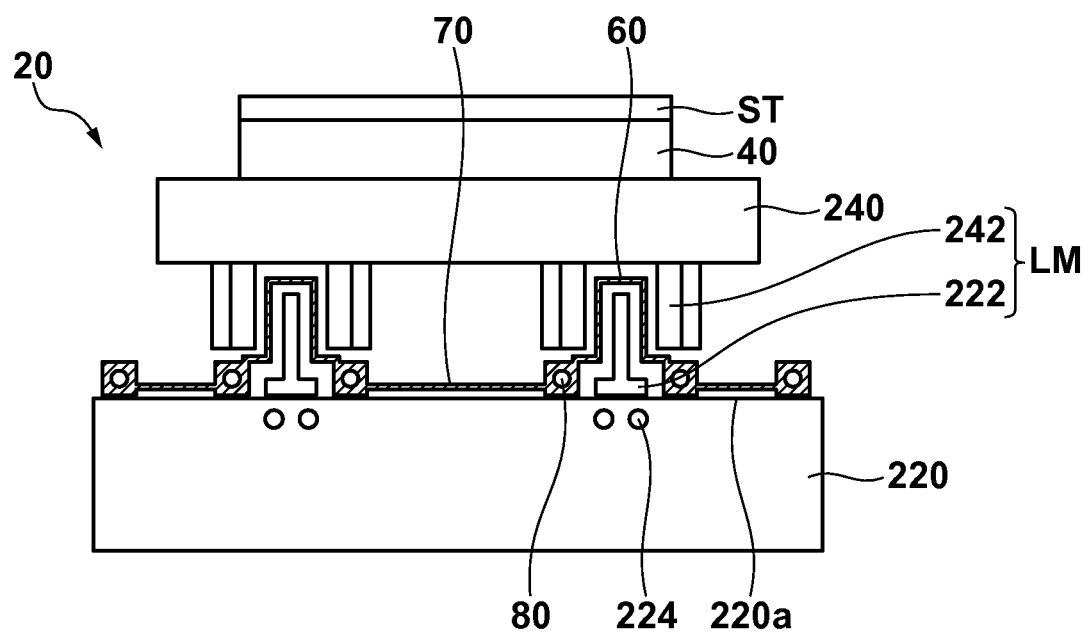
FIG. 2 is a schematic view showing the arrangement of the stage apparatus of the lithography apparatus shown in FIG. 1.

FIG. 2 is a schematic view showing the arrangement of the stage apparatus 20. As shown in FIG. 2, a coil (coil unit) 222 is arranged on the coarse moving stage 220. Also, a magnet (magnet unit) 242 is arranged (fixed) on the fine moving stage 240 in correspondence with the coil 222. The coil 222 and magnet 242 constitute a linear motor LM which moves the fine moving stage 240 by a magnetic field generated by supplying a current to the coil 222.

A first channel 224 through which a refrigerant (first refrigerant) can flow is formed inside the coarse moving stage 220. The refrigerant flows through the first channel 224 to recover heat generated by the coil 222. In the embodiment, as shown in FIG. 2, the first channel 224 is formed inside the coarse moving stage 220 so the refrigerant for recovering heat from the coil 222 does not contact the coil 222. The first channel 224 is formed inside the coarse moving stage 220 so that at least part of the first channel 224 overlaps the coil 222 when the first channel 224 is projected on a surface 220a of the coarse moving stage 220 on the fine moving stage side (second moving stage side). Hence, heat from the coil 222 can be recovered efficiently. Instead of forming the first channel 224 inside the coarse moving stage 220, a liquid cooling block in which the first channel 224 is formed may be attached between the coarse moving stage 220 and the coil 222 (that is, on the coarse moving stage 220).

A cover member 60 is arranged in a region where the fine moving stage 240 and magnet 242 face the coarse moving stage 220 and coil 222. In other words, the cover member 60 is arranged on the coarse moving stage 220 so that it surrounds the coil 222 and is spaced apart from the coil 222. In the embodiment, as shown in FIG. 2, the cover member 60 has a section of a convex shape formed by connecting a left horizontal line, left vertical line, central horizontal line, right vertical line, and right horizontal line, in order to surround the coil 222 having a section of a convex shape (shape which is convex toward the fine moving stage).

A sheet member 70 is arranged on the coarse moving stage 220 so that it is coupled to the cover member 60, covers the surface 220a of the coarse moving stage 220 on the fine moving stage side, and is spaced apart from the surface 220a. However, the sheet member 70 may be constituted not separately from the cover member 60 but together with the cover member 60.

A second channel 80 through which a refrigerant (second refrigerant) can flow is formed in part of the cover member 60 and sheet member 70. The refrigerant flows through the second channel 80 to control the temperatures of the cover member 60 and sheet member 70 to be constant. In the embodiment, as shown in FIG. 2, the second channel 80 is formed in the cover member 60 and sheet member 70 so the refrigerant for recovering heat from the cover member 60 and sheet member 70 does not contact the coil 222.

In this arrangement of the stage apparatus 20, heat generated by the coil 222 transfers mainly to the coarse moving stage 220 by heat conduction, and is recovered by the refrigerant flowing through the first channel 224 inside the coarse moving stage 220. At this time, the heat resistance exists on a path extending from the coil 222 serving as a heat source to (the refrigerant flowing through) the first channel 224. The temperature of the coil 222 rises in accordance with a value determined by the heat flow×the heat resistance from the coil 222 to the first channel 224. As a result, a temperature difference is generated between the coil 222 and the fine moving stage 240, and radiant heat tries to transfer from the coil 222 to the fine moving stage 240. However, an object facing the coil 222 is the cover member 60, and heat radiated to the cover member 60 is recovered by the refrigerant flowing through the second channel 80 formed in the cover member 60. Hence, heat generated by the coil 222 does not directly transfer to the fine moving stage 240 or magnet 242. When heat from the coil 222 is not satisfactorily recovered by the refrigerant flowing through the first channel 224, the heat tries to transfer to the fine moving stage 240 via (the surface 220a of) the coarse moving stage 220. In the embodiment, however, the sheet member 70 is arranged, as described above. Thus, the heat which tries to transfer to the fine moving stage 240 via the coarse moving stage 220 does not directly transfer to the fine moving stage 240 or magnet 242.

Since the temperature rise of the cover member 60 by radiant heat from the coil 222 is much smaller than the temperature rise of the coil 222, radiant heat from the cover member 60 to the fine moving stage 240 hardly contributes to heat deformation of the fine moving stage 240. It is sometimes necessary to reduce heat indirectly transferring from the coil 222 to the fine moving stage 240. In such a case, the emissivities of the surface of the coil 222, the surfaces of the cover member 60 and sheet member 70, and the surface of the fine moving stage 240 (magnet 242) facing the cover member 60 and sheet member 70 are decreased. To decrease the emissivity, for example, the surface is plated with a low-emissivity metal or the like. Further, if a high-heat-conductivity material is used for the cover member 60 and sheet member 70, the heat resistance of a path until radiant heat from the coil 222 is recovered by the refrigerant flowing through the second channel 80 can be decreased, and the temperature rise of the cover member 60 and sheet member 70 can be further suppressed. Examples of the high-heat-conductivity material are copper, aluminum, CFRP, and diamond. Even in a region overlapping the magnetic gap of the linear motor LM, the second channel 80 may be formed in the cover member 60 to supply a refrigerant, and the region where the temperature of the cover member 60 is grounded may be enlarged. This can decrease the temperature rise of the cover member 60.

The second channel 80 serving as the temperature ground of the cover member 60 is formed so that the refrigerant directly contacts the cover member (that is, a channel is directly formed in the cover member 60). However, even if the second channel 80 is separated from the cover member 60, it suffices to thermally contact the cover member 60.

An adiabatic material may be interposed between the cover member 60 and the coarse moving stage 220 to support the cover member 60. This arrangement can reduce or prevent transfer of heat from the coil 222 to the cover member 60 and sheet member 70 via the coarse moving stage 220 and further to the fine moving stage 240.

Note that the position at which the second channel 80 is formed is not particularly limited. However, by forming the second channel 80 inside the connecting portion of the cover member 60 at which the cover member 60 is connected to the coarse moving stage 220, heat can be efficiently recovered from the cover member 60 and sheet member 70. Also, by forming the second channel 80 at a portion of the cover member 60 except for facing portions at which the cover member 60 faces the coil 222 and magnet 242, the gap between the coil 222 and the magnet 242 can be reduced.

As described above, in the stage apparatus 20 according to the embodiment, most of heat from the coil 222 of the linear motor LM is recovered by a refrigerant flowing through the first channel 224. The heat which has not been recovered by the first channel 224 and remains is recovered by a refrigerant flowing through the second channel 80, thereby suppressing transfer of the heat to the fine moving stage 240. Especially in the vacuum atmosphere, the amount of heat conduction to the fine moving stage 240 by radiation can be greatly reduced. Since the refrigerant does not contact the coil 222 in the stage apparatus 20 according to the embodiment, the surface of the coil 222 does not corrode and the reliability of the stage apparatus 20 can be maintained.

When transferring a pattern to the substrate ST in the lithography apparatus 1, the stage apparatus 20 positions the substrate ST with respect to (a charged particle beam emitted by) the charged particle optical system 10. As described above, the stage apparatus 20 can greatly reduce heat transferring from the coil 222 to the fine moving stage 240 (that is, can suppress heat deformation of the fine moving stage 240), and maintain the reliability of the stage apparatus 20. The stage apparatus 20 can therefore position the substrate ST with respect to the charged particle optical system 10 at high precision.

The lithography apparatus 1 according to the embodiment can provide an article such as a semiconductor device, LCD element, image sensor (for example, CCD), or thin-film magnetic head at high throughput, low cost, and high quality. A method of manufacturing a device serving as an article includes a step of transferring a pattern on a substrate (for example, a wafer, glass plate, or film-like substrate) using the lithography apparatus 1. The manufacturing method further includes a step of processing (for example, oxidization, deposition, vapor deposition, doping, planarization, etching, resist removal, dicing, bonding, and packaging) the substrate on which the pattern has been transferred.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-152913 filed on Jul. 23, 2013, which is hereby incorporated by reference herein in its entirety.

What is claimed is:

1. A stage apparatus which holds a substrate, comprising:
a first moving stage;
a second moving stage supported by the first moving stage;
a linear motor including a coil arranged on the first moving stage, and a magnet arranged on the second moving stage in correspondence with the coil;
a first channel formed in the first moving stage to supply a first refrigerant for recovering heat from the coil not to contact the coil;
a cover member arranged on the first moving stage to surround the coil and be spaced apart from the coil; and
a second channel formed in the cover member to supply a second refrigerant for recovering heat from the cover member not to contact the coil.

2. The apparatus according to claim 1, wherein the first channel is formed in the first moving stage to make at least part of the first channel overlap the coil when the first channel is projected on a surface of the first moving stage on a side of the second moving stage.

3. The apparatus according to claim 1, wherein
the cover member includes a connecting portion at which the cover member is connected to the first moving stage, and
the second channel is formed inside the connecting portion.

4. The apparatus according to claim 1, wherein
the cover member includes facing portions at which the cover member faces the coil and the magnet, and
the second channel is formed at a portion of the cover member except for the facing portions.

5. The apparatus according to claim 1, further comprising a sheet member arranged on the first moving stage so as to be coupled to the cover member, cover a surface of the first moving stage on a side of the second moving stage, and be spaced apart from the surface of the first moving stage on the side of the second moving stage.

6. The apparatus according to claim 1, further comprising an adiabatic material interposed between the cover member and the first moving stage, and configured to support the cover member.

7. A lithography apparatus comprising:
a stage apparatus defined in claim 1; and
a processing unit configured to perform a transfer process of transferring a pattern on a substrate held by the stage apparatus.

8. The apparatus according to claim 7, further comprising a chamber configured to accommodate the stage apparatus and the processing unit,
wherein the chamber maintains, in a vacuum atmosphere, an internal space in which the stage apparatus and the processing unit are accommodated.

9. The apparatus according to claim 7, wherein the transfer process includes a process of transferring the pattern on the substrate by performing drawing on the substrate with a charged particle beam.

10. A method of manufacturing an article, the method comprising:
transferring a pattern on a substrate using a lithography apparatus; and
processing the substrate on which the pattern has been transferred,
wherein the lithography apparatus includes:
a stage apparatus configured to hold the substrate; and
a processing unit configured to perform a transfer process of transferring the pattern on the substrate held by the stage apparatus, and
wherein the stage apparatus includes:
a first moving stage;
a second moving stage supported by the first moving stage;
a linear motor including a coil arranged on the first moving stage, and a magnet arranged on the second moving stage in correspondence with the coil;
a first channel formed in the first moving stage to supply a first refrigerant for recovering heat from the coil not to contact the coil;
a cover member arranged on the first moving stage to surround the coil and be spaced apart from the coil; and
a second channel formed in the cover member to supply a second refrigerant for recovering heat from the cover member not to contact the coil.

* * * * *